United States Patent
Gupta et al.

(10) Patent No.: US 7,420,490 B2
(45) Date of Patent: Sep. 2, 2008

(54) PRE-CHARGE SYSTEMS AND METHODS FOR ADC INPUT SAMPLING

(75) Inventors: Amit Kumar Gupta, Dallas, TX (US); Karthikeyan Soundarapandian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/461,060

(22) Filed: Jul. 31, 2006

(65) Prior Publication Data

US 2008/0024351 A1    Jan. 31, 2008

(51) Int. Cl.
*H03M 1/00*  (2006.01)
(52) U.S. Cl. ........................................ 341/122; 341/155
(58) Field of Classification Search ................ 341/155, 341/172, 122, 156
See application file for complete search history.

(56) References Cited

U.S. PATENT DOCUMENTS 5,617,093 A * 4/1997 Klein .......................... 341/172

\* cited by examiner

*Primary Examiner*—Peguy JeanPierre
(74) *Attorney, Agent, or Firm*—Warren L. Franz; Wade J. Brady, III; Frederick J. Telecky, Jr.

(57) ABSTRACT

The invention provides methods and systems useful for quickly and accurately sampling a switched capacitive load. Systems are disclosed in which the methods are implemented using an operational amplifier operably coupled to a pre-charge capacitor for storing an input charge. A sampling capacitor is also coupled to the operational amplifier and to the pre-charge capacitor for receiving and holding the input charge. The system is so configured for a coarse sampling phase and a fine sampling phase the to ensure that the sampling capacitor settles quickly to provides an output.

7 Claims, 1 Drawing Sheet

PRE-CHARGE SYSTEMS AND METHODS FOR ADC INPUT SAMPLING

TECHNICAL FIELD

The invention relates to electronic semiconductor devices and manufacturing. More particularly, the invention relates to input drivers for analog to digital converters (ADC) and to systems and methods for implementing the same.

BACKGROUND OF THE INVENTION

An analog to digital converter (ADC) system typically uses an input driver circuit to sample an analog signal for input to the converter. Depending on the application, there may be a need to manipulate the signal in various ways in order to make use of the capabilities of the ADC. Op amp circuitry is typically used to perform one or more operations such as inverting, attenuating, multiplying, and shifting the input signal to be operated on by the ADC. The ADC cannot convert a moving target, necessitating that the sample of the input signal be held for a period of time. Ideally, a holding capacitor is instantaneously charged to the input voltage, the sampled charge is held for the ADC, and the sample is then converted by the ADC. Departures from the ideal occur in practice due to several problems.

In systems having a capacitive load, op amp sampling circuits have inherent instability problems. Compensation capacitance may be added to offset the phase delay of the capacitive load and keep the system under control, but increasing the compensation capacitor in order to enhance stability has the undesirable side-effect of increasing rise time and reducing bandwidth. As the resolution and speed of ADCs increases, it becomes increasingly difficult to use an op amp to drive the switching input load of high-speed over-sampling ADCs. An approach known in the arts is to attempt to use a feedback network of resistors and capacitors to increase stability. In some instances, the system input driver may be integrated onto the ADC chip to reduce the component count, e.g., the opamp and associated passives, as well as to eliminate a power supply, which is very desirable. In order to arrive at a satisfactory configuration using an opamp to drive a high performance ADC, it is often necessary for the user to make adjustments to the R and C at the input according to performance measurements, making such solutions costly and application-specific.

Spurious free dynamic range (SFDR) is the measure of the difference of the fundamental signal and the largest spur among the samples. The SFDR in general is approximately equal to the worst case signal to noise ratio (SNR). There is a need in the arts for higher bandwidths with both better SNR and SFDR. This in turn means that in order to keep the same over-sampling ratio, the clock frequency as well as the sampling capacitor size must be increased. The SFDR of the sampled signal in these cases is limited by how fast the input amplifier can settle in response to the step at the output caused by the switching load. Since the available time to settle is only one half of a clock cycle, it becomes extremely difficult for the amplifier to settle, to 16-18-bit linearity for example, as the clock frequencies increase, and also as the value of capacitor being switched increases. Traditionally a low pass RC filter is placed in the driver circuit to filter out high frequency thermal noise from the driving opamp and any resistors included in the opamp configuration. This approach becomes less effective as the signal frequency increases, since the −3 db bandwidth of the filter has to be increased to prevent signal attenuation, implying that high frequency thermal noise will necessarily also increase. Moreover, this approach falls short of achieving very good SFDR numbers because the output at the RC filter is a slow moving node and requires a relatively long settling time. This technique works only if the switching capacitor is a very small fraction of the capacitor in the RC filter so that majority of the charge is provided to the capacitor by charge sharing. Additionally, there must be sufficient time for the output to settle for required accuracy. This is generally not the case in high speed over-sampling ADCs. These problems are often encountered in high speed pipelined ADC systems as well as successive approximation register (SAR) ADCs.

Another important practical problem encountered in the arts is that high-speed amplifiers are generally manufactured using BICMOS processes. If the ADC system is implemented using a slow CMOS process to achieve higher swings, then it may not be practical to integrate very fast amplifiers into the system because of the effect of parasitic capacitances on bandwidth and slew rate. One approach known in the arts is to configure a system with a multi-chip module (MCM), having both a BICMOS amplifier and a CMOS ADC together in the same package. However, those familiar with the applicable arts will recognize that this approach to the problem presents additional problems from a manufacturing point of view.

For fully differential circuits, load capacitors switched in the sampling phase are traditionally used, sometimes also with the addition of an RC filter at the driver output. Such a circuit uses a continuous time amplifier with a load capacitor connected during sampling clock phases. Such an amplifier is required to be extremely fast to settle to desired accuracy in one-half clock cycle. It is known to use a pre-charging scheme in SAR converters to relax the requirements on the input driver. The desired effect of this technique is to relax the requirement on the external amplifier by having an internal pre-charge buffer to provide the initial surge current and provide an initial sampling of the input. The pre-charge buffer drives the input during a pre-charge phase, after which the external driver takes over during the sampling phase. One particular disadvantage of this approach is the requirement to use an additional buffer, which means additional power is required. Another problem is that the power consumption for the pre-charge buffer may be excessive.

There is a need in the arts for improved systems and methods for input driver circuits useful for reducing or eliminating one or more of these and possibly other problems, particularly for use in the context of high speed ADC systems.

SUMMARY OF THE INVENTION

In carrying out the principles of the present invention in accordance with preferred embodiments thereof, the invention provides methods and systems facilitating practical input drivers for capacitive loads. Embodiments of the invention are suitable for implementation using CMOS technology.

According to one aspect of the invention, a system for sampling a switched capacitive load includes an operational amplifier operably coupled to a pre-charge capacitor for storing an input charge. A sampling capacitor is also coupled to the operational amplifier and to the pre-charge capacitor for receiving and holding the input charge. The system is so configured that during a coarse sampling phase the pre-charge capacitor and sampling capacitor can be at least partially charged. During a fine sampling phase the pre-charge capacitor can be decoupled so that the sampling capacitor settles to provide a suitable sample.

According to another aspect of the invention, in an exemplary embodiment thereof, a system for driving a switched capacitive input load for an analog to digital converter includes an op amp operably coupled to a sampling network configured for sampling an input. The sampling network is also configured for holding the sampled input for the analog to digital converter using a pre-charging capacitor and a sampling capacitor arranged in a configuration whereby the pre-charging capacitor at least partially charges the sampling capacitor.

According to yet another aspect of the invention, an embodiment is disclosed in which a method for regulating the input to an analog to digital converter system includes a step for, during a non-sampling phase of a system clock cycle, using an operational amplifier in a slow pre-charging mode for charging a large pre-charge capacitor. In a further step, during a coarse sampling phase of the clock cycle, the pre-charge capacitor is used to charge a sampling capacitor. Thereafter, the pre-charge capacitor is decoupled from the sampling capacitor. During a fine sampling phase of the clock cycle, the operational amplifier is used in a fast sampling mode to sample the charge on the sampling capacitor for input to the analog to digital converter system.

According to still other aspects of the invention wherein a pre-charge capacitor is used in coordination with a sampling capacitor, the capacitance of the pre-charge capacitor is about ten times the capacitance of the sampling capacitor.

According to aspects of the invention more fully described herein, methods are used for coordinating the use of a pre-charge capacitor with a sampling capacitor wherein the duration of a pre-charge phase is within a range of approximately one-tenth to one-sixth of the total sampling time.

The invention has one or more advantages potentially including but not limited to providing input driver methods and systems with reduced power requirements, improved SNR, improved SFDR performance, and adaptability for use with various types of ADC systems. The features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following description and drawings in which.

Figure 1:
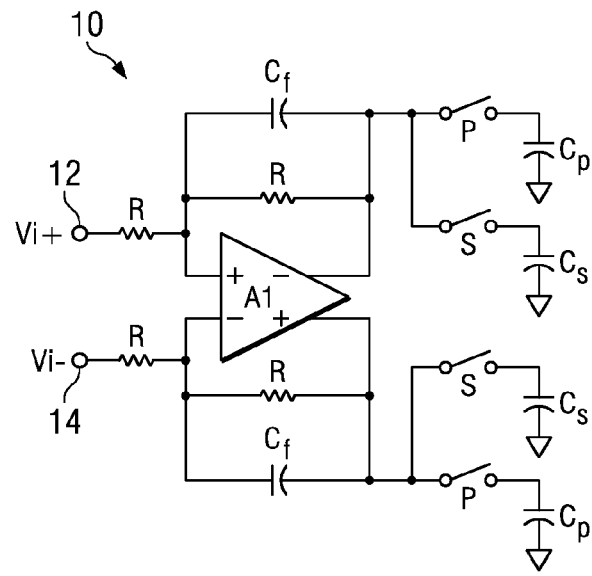
FIG. 1 is a simplified schematic circuit diagram illustrating an example of an ADC driver system embodying the methods of the invention.

References in the description correspond to like references in the various drawings unless otherwise noted. Descriptive, polarity, and directional terms used in the written description such as top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF REPRESENTATIVE EMBODIMENTS

In general, the invention provides novel pre-charge methods and systems embodied in high performance analog to digital converter input drivers. An exemplary embodiment of the invention is portrayed in the schematic diagram of FIG. 1. An ADC driver system 10 is shown with an op amp A1 for sampling the inputs, 12, 14. For using the system 10 with a high performance ADC, an amplifier A1 that is sufficiently fast and accurate for the application is selected. It may enhance appreciation of the principles of the invention to consider the underlying, but perhaps easily overlooked fact that speed and accuracy are only required of the op amp A1 during the intervals when the ADC system is actually sampling the input. It follows that during the other phase of the operative clock cycle, the amplifier A1 may be used as described. Examining FIG. 1, it may be seen that the system 10 is configured so that during the non-sampling phase of the clock cycle, the amplifier A1 may be operated as a slow amplifier charging a large pre-charge capacitor Cp. Preferably, for effective pre-charging, the pre-charge capacitor Cp may be on the order of about ten times the capacitance of the sampling capacitor Cs, e.g.; $Cp \approx k*Cs$, for k=10. In some applications, for example where saving area is at a premium, a pre-charge capacitor of about the same value as Cs may be used. Of course, any pre-charge capacitor value between about Cs and 10*Cs may be used without departure from the invention, depending upon considerations such as available area and amount of pre-charging desired. The sampling capacitor Cs is used during the sampling phase of the clock cycle as further described.

Thus, in operation of the system 10, sampling takes place according to two phases as follows. During a coarse pre-charge phase, preferably of a duration of approximately one-tenth to one-sixth of the total sampling time, the amplifier A1 is operated as a slow amplifier, the charge to the sampling capacitor Cs is provided by the larger pre-charge capacitor Cp at the output by charge sharing. Preferably, with Cp 10*Cs, the output reaches a value approaching to within about 85-95% of its final value during this phase. With a smaller Cp, a lesser pre-charge level may be used, for example 50% for Cp Cs. Subsequently, during a fine sampling phase, the high-speed capabilities of the amplifier A1 are used to sample the charge on the sampling capacitor Cs, and the pre-charge capacitor Cp is disconnected from the output. The amplifier A1 then operates such that output quickly settles to the desired accuracy for use by the ADC system. Of course, additional feedback networks may be used as represented by resistors R and capacitors Cf. Also, it should be understood by those conversant in the arts that circuits shown herein are representative of preferred embodiments and that equivalent circuits may be used without departure from the principles of the invention.

Figure 2:
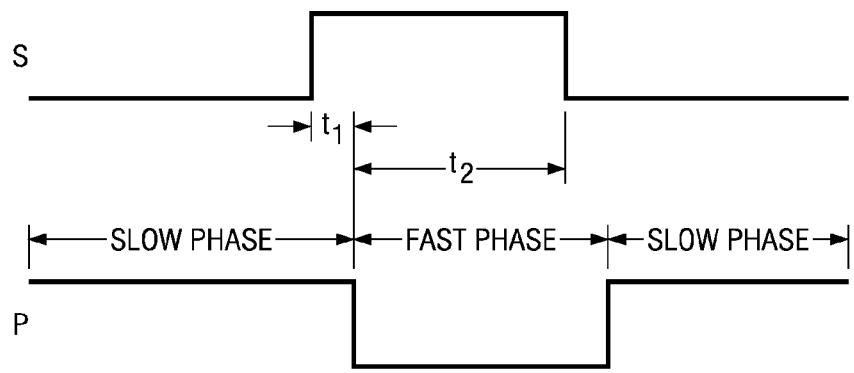
FIG. 2 is a timing diagram illustrating an example of the operation of preferred embodiments of the methods and systems of the invention.

FIG. 2 is a timing diagram further illustrating an example of the operation of preferred embodiments of the methods and systems of the invention. The pre-charge phase, during which the pre-charge capacitor Cp is charged, is indicated by trace P. The sampling phase, during which the sampling capacitor Cs is sampled, is shown by trace S. It may be seen that the time corresponding to the coarse sampling phase, during which the pre-charge capacitor and sampling capacitor are coupled for charge sharing, is indicated by t1. The fine sampling phase is indicated by t2.

Figure 3:
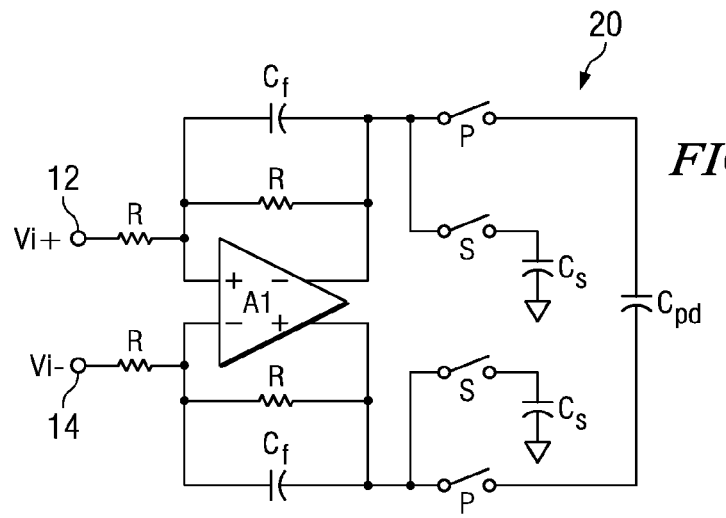
FIG. 3 is a simplified schematic circuit diagram illustrating an example of an alternative embodiment of an ADC driver system embodying the methods of the invention.

In an example of an alternative embodiment of a system of the invention, as shown in FIG. 3, in order to reduce the area penalty which may be encountered by including large pre-charge capacitors Cp as shown in FIG. 1, a pre-charge capacitor Cpd may be placed in a differential configuration 20. This configuration 20 permits the reduction of the area used for the pre-charge capacitor(s) by a factor of two, for example, with k=10, Cpd≈k/2*Cs. This alternative embodiment of the invention occupies less chip area while the functioning of the system remains essentially unchanged from that described herein with reference to FIG. 2. That is, the differential pre-charge capacitor Cpd is charged during the pre-charge phase, and the sampling capacitor Cs is substantially charged by charge sharing with the pre-charge capacitor Cpd. The pre-charge capacitor Cpd is decoupled from the output, and the sampling capacitor Cs rapidly settles for an accurate sample.

Based on the disclosed examples, those skilled in the arts should appreciate that there are numerous possibilities for systems and methods using the principles of the invention. The principles of the invention may be implemented using various types of operational amplifiers in input stages for circuits, such as many types of ADC, either on-chip or on-board. The methods and systems of the invention provide one or more advantages which may include: improved SNR; improved SFDR; reduced power consumption; integration of ADCs and input drivers using CMOS manufacturing processes. While the invention has been described with reference to certain illustrative embodiments, those described herein are not intended to be construed in a limiting sense. For example, variations or combinations of steps in the embodiments shown and described may be used in particular cases without departure from the invention. For example, the principles of the invention may be applied in systems including but not limited to differential input to single-ended output, single-ended input to single-ended output, single-ended input to differential output, differential input to differential output. Modifications and combinations of the illustrative embodiments as well as other advantages and embodiments of the invention will be apparent to persons skilled in the arts upon reference to the drawings, description, and claims.

We claim:

1. A method for regulating the input to an analog to digital converter system comprising the steps of:

during a non-sampling phase of a system clock cycle, using an operational amplifier in a slow pre-charging mode for charging a large pre-charge capacitor;

during a course sampling phase of the clock cycle, using the pre-charge capacitor to charge a sampling capacitor and thereafter decoupling the pre-charge capacitor from the sampling capacitor;

during a fine sampling phase of the clock cycle, using the operational amplifier in a fast sampling mode to sample the charge on the sampling capacitor; and inputting the sample to the analog to digital converter system.

2. A method according to claim 1 wherein the capacitance of the pre-charge capacitor Cp is about ten times the capacitance of the sampling capacitor.

3. A method according to claim 1 wherein the duration of the pre-charge phase is within a range of approximately one-tenth to one-fifth of the total sampling time.

4. A method according to claim 1 wherein during the pre-charge phase, the sampling capacitor Cs is charged to a range of within about 85-95% of its final value.

5. A method according to claim 1 wherein the capacitance of the pre-charge capacitor Cp is within a range of within one to about ten times the capacitance of the sampling capacitor.

6. A method according to claim 1 wherein the duration of the pre-charge phase is approximately one-seventh of the total sampling time.

7. A method according to claim 1 wherein during the pre-charge phase, the sampling capacitor Cs is charged to a range of within about 50-85% of its final value.

* * * * *